(12) United States Patent
Watanabe et al.

(10) Patent No.: US 7,578,630 B2
(45) Date of Patent: Aug. 25, 2009

(54) CONTROL PANEL AND APPARATUS USING THE SAME

(75) Inventors: Yohichi Watanabe, Tokyo (JP);
Masanao Takahashi, Tokyo (JP);
Masateru Kohno, Kanagawa (JP);
Satoshi Odanaka, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 1 day.

(21) Appl. No.: 10/933,213

(22) Filed: Sep. 3, 2004

(65) Prior Publication Data
US 2005/0109883 A1 May 26, 2005

(30) Foreign Application Priority Data
Sep. 8, 2003 (JP) ............................. 2003-315422

(51) Int. Cl.
*B41J 11/62* (2006.01)
(52) U.S. Cl. ...................................... 400/714; 400/713
(58) Field of Classification Search ................ 248/551, 248/346.01, 349.1, 346.03; 312/257.1, 263, 312/228, 279; 400/714, 472, 473, 713; 235/145 R
See application file for complete search history.

(56) References Cited
U.S. PATENT DOCUMENTS 4,671,688 A * 6/1987 Brashears ................... 400/714
5,197,178 A * 3/1993 Lichte et al. ................. 29/428
5,738,424 A * 4/1998 Katz et al. ................ 312/293.3
6,054,939 A * 4/2000 Wei et al. ..................... 341/20
6,674,982 B2 1/2004 Saitoh et al. ................ 399/110
6,757,515 B2 6/2004 Ueda .......................... 399/396
2005/0109883 A1 5/2005 Watanabe et al.

FOREIGN PATENT DOCUMENTS

| JP | S59-53436 | 4/1984 |
| JP | 06-237427 | 8/1994 |
| JP | 09-083692 | 3/1997 |
| JP | 09-128122 | 5/1997 |
| JP | 2005107462 A * | 4/2005 |

OTHER PUBLICATIONS

U.S. Appl. No. 11/552,599, filed Oct. 25, 2006, Odanaka.

* cited by examiner

*Primary Examiner*—A. Joseph Wujciak, III
(74) *Attorney, Agent, or Firm*—Oblon, Spivak, McClelland, Maier & Neustadt, P.C.

(57) ABSTRACT

A control panel of the present invention includes a base and a mount mounted on the base and loaded with a display and devices to be operated by the operator of the apparatus. The base includes a support portion for supporting the mount. The support portion supports the front edge portion of the mount by causing it to slidably contact the front edge portion of the support portion in substantially the front-and-rear direction and supports the rear wall of the mount with its rear wall such that the rear wall of the mount is movable in the up-and-down direction and can be fixed in position in the same direction. The angle of the top of the mount is therefore variable without resorting to extra members for angular movement.

9 Claims, 6 Drawing Sheets

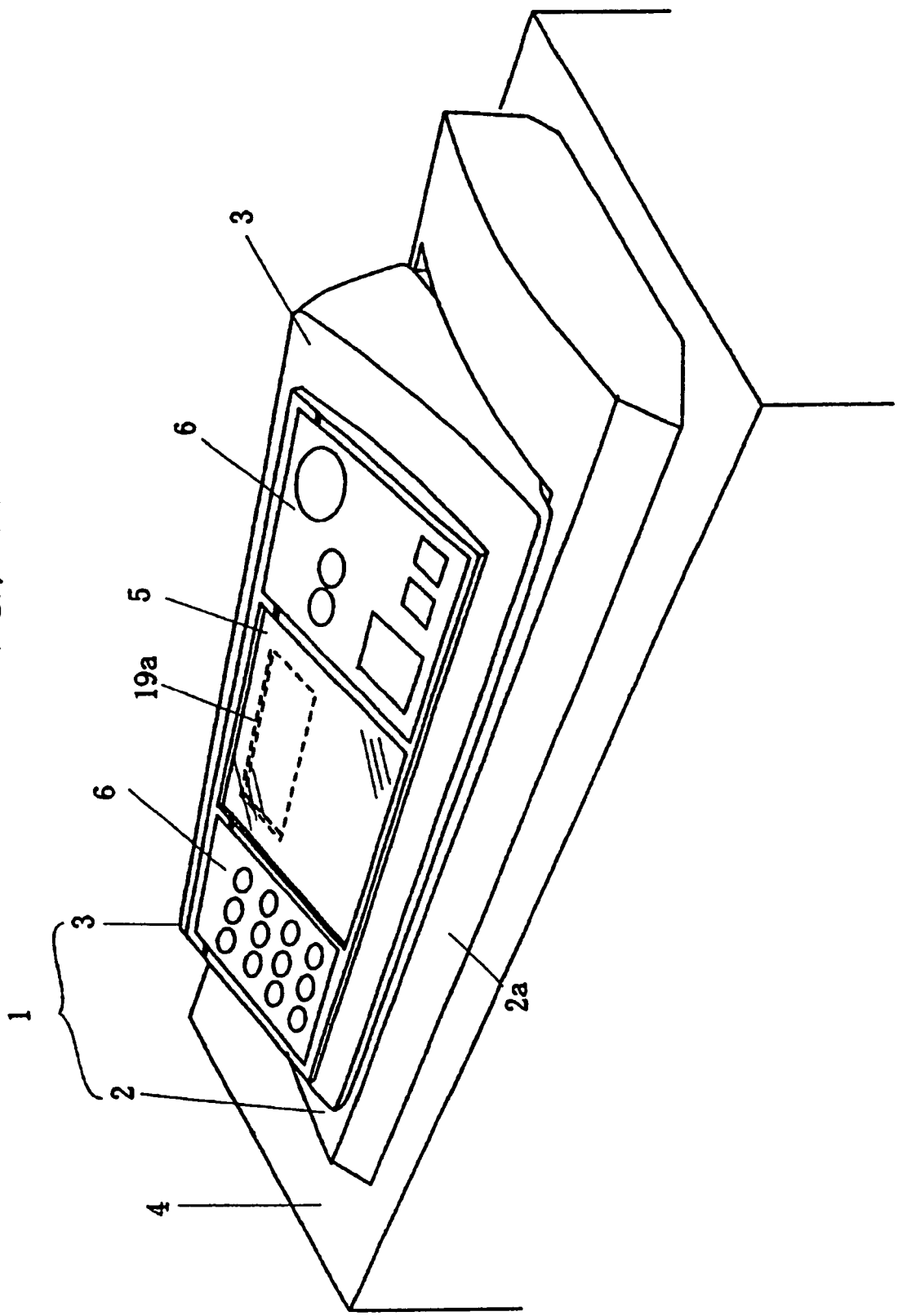

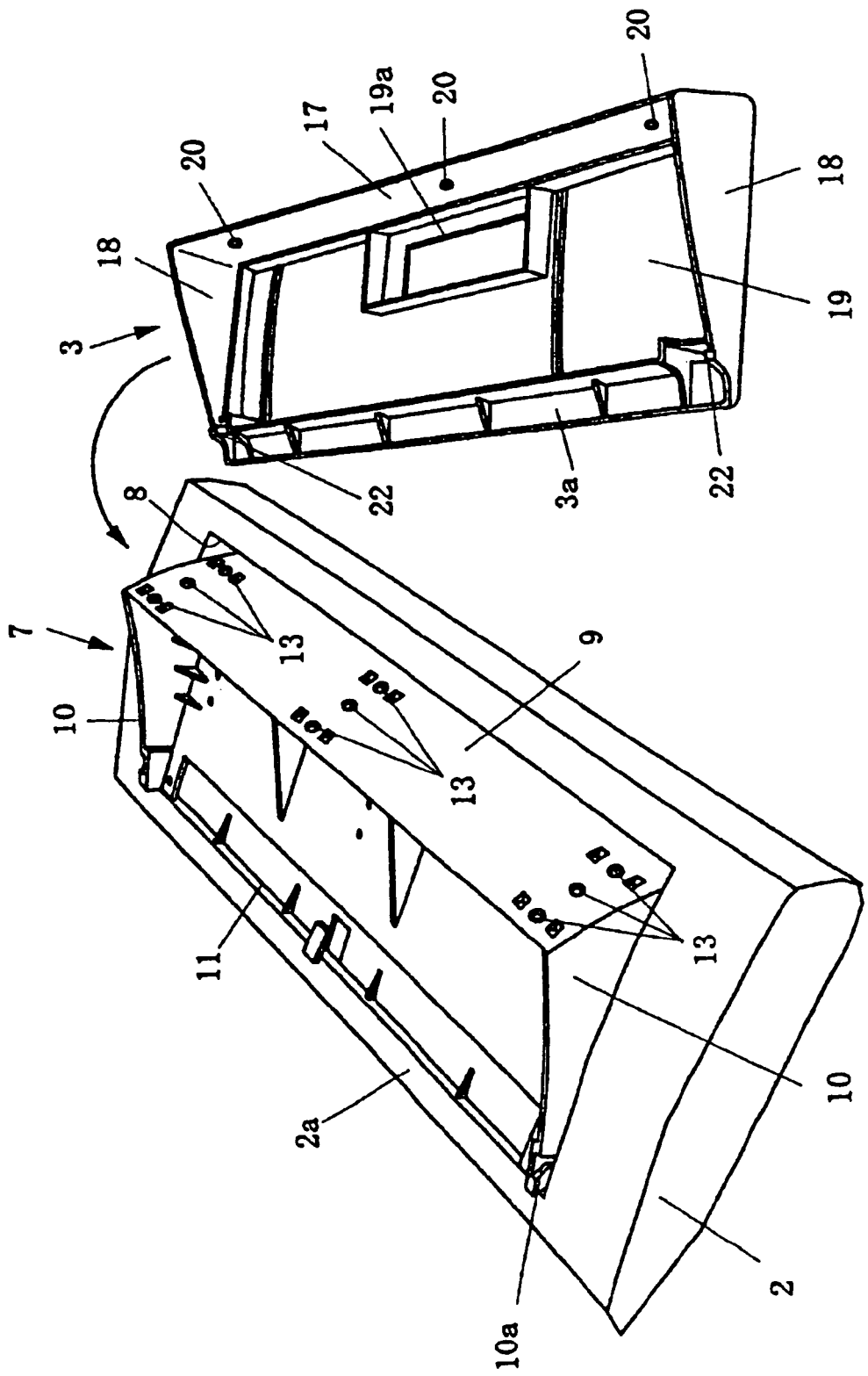

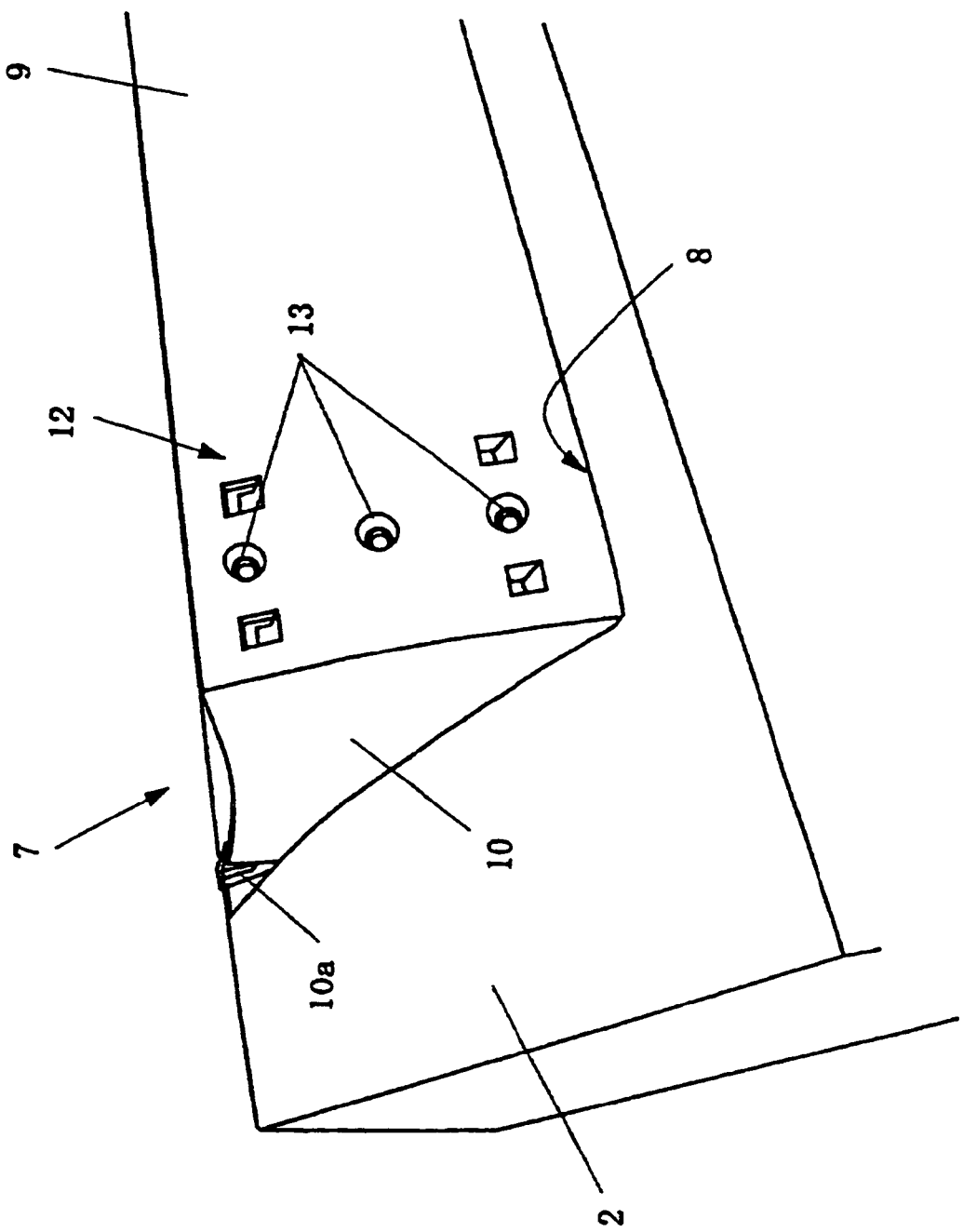

CONTROL PANEL AND APPARATUS USING THE SAME

BACKGROUND OF THE INVENTION

1. Field of the Invention

The present invention relates to a control panel and an apparatus using the same.

2. Description of the Background Art

One type of conventional control panel for use in various apparatuses includes a mount for mounting a touch panel or similar inputting device and a base including a support portion for supporting the mount. This type of control panel is sometimes configured such that the angle of the mount and therefore the angle of, e.g., the top of the touch panel is variable, so that a person can easily see the touch panel without regard to the person's height or eye level or glare or similar environmental condition.

It is a common practice with the control panel of the type described to include exclusive parts and mechanisms for varying the angle of the mount and separate from the mount and base. The exclusive parts and mechanisms, however, not only increase the cost of the control panel, but also obstruct recycling keenly demanded today for environmental preservation.

SUMMARY OF THE INVENTION

It is an object of the present invention to provide an inexpensive control panel not needing the exclusive parts or mechanisms stated above and facilitating recycling of parts for environmental preservation and an apparatus using the same.

A control panel of the present invention includes a base and a mount mounted on the base and loaded with a display and devices to be operated by the operator of the apparatus. The base includes a support portion for supporting the mount. The support portion supports the front edge portion of the mount by causing it to slidably contact the front edge portion of the support portion in substantially the front-and-rear direction and supports the rear wall of the mount with its rear wall such that the rear wall of the mount is movable in the up-and-down direction and can be fixed in position in the same direction. The angle of the top of the mount is therefore variable without resorting to extra members for angular movement.

BRIEF DESCRIPTION OF THE DRAWINGS

The above and other objects, features and advantages of the present invention will become more apparent from the following detailed description taken with the accompanying drawings in which:

FIG. 1A is an isometric view showing a control panel embodying the present invention together with an apparatus on which it is mounted;

FIG. 1B is an exploded view of the control panel shown in FIG. 1A;

FIG. 2 is a fragmentary isometric view showing the rear surface of a base and the rear surface of a mount included in the illustrative embodiment;

DESCRIPTION OF THE PREFERRED EMBODIMENTS

Figure 3:
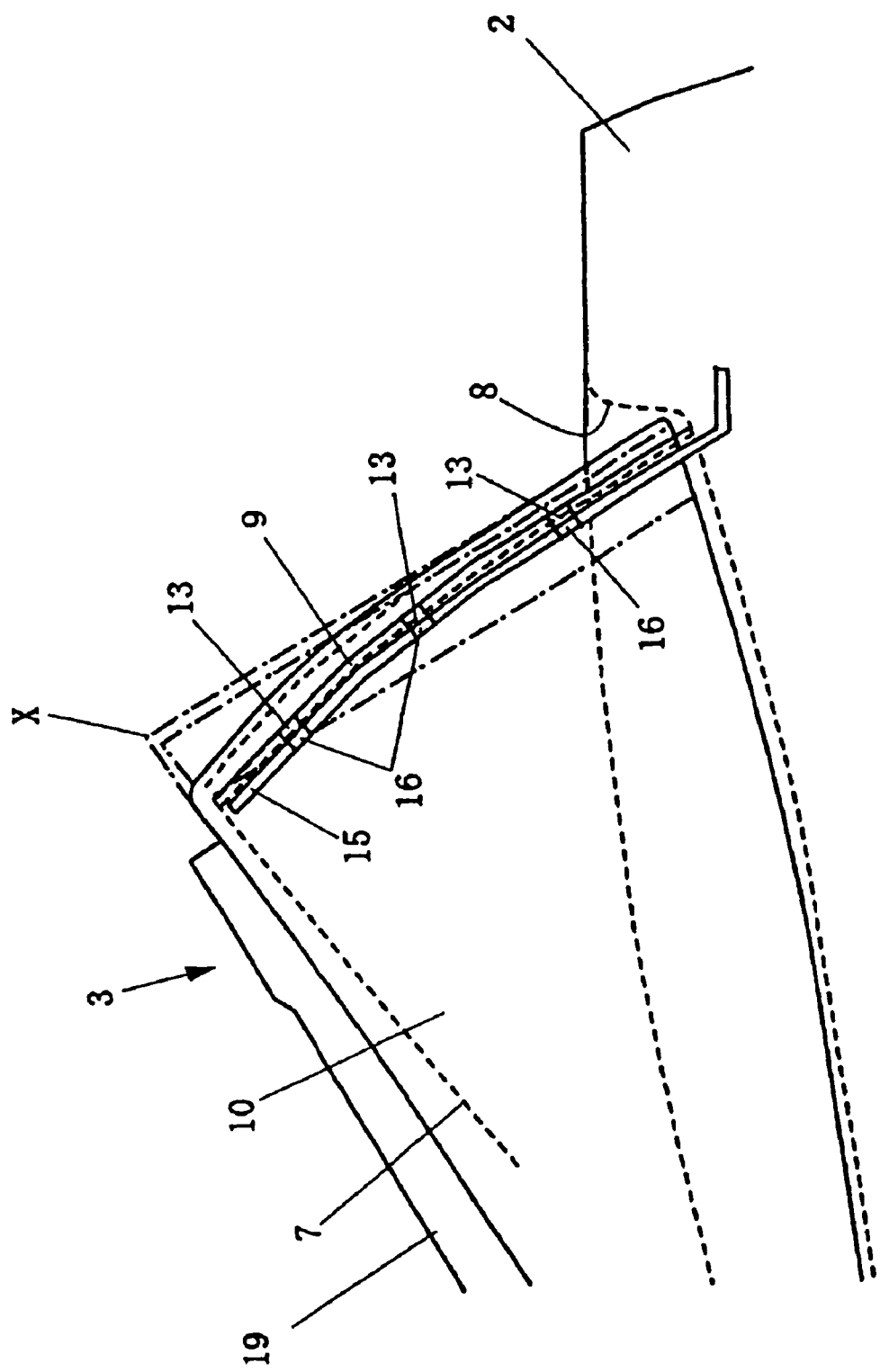
FIG. 3 is a section of the portion of the illustrative embodiment shown in FIG. 2.

While preferred embodiments of the control panel in accordance with the present invention to be described hereinafter are applied to a copier or similar image forming apparatus, the present invention is, of course, applicable to other various apparatuses as well.

Referring to FIGS. 1A and 1B, a control panel embodying the present invention is shown together with a printer or similar image forming apparatus on which it is mounted. As shown, the control panel, generally 1, is made up of a base 3 and a mount 3. The base 2 is mounted on the image forming apparatus, designated by the reference numeral 4, or is configured to form part of the casing of the apparatus 4: Display panels 5 and 6 and so forth are mounted on the mount 3, which is, in turn, mounted on the base 2.

The base 2 and mount 3 may be implemented by moldings of, e.g., synthetic resin separate from each other. Such moldings, each having a particular configuration to be described later specifically, can be simply removed from a mold in the up-and-down direction although they may, of course, be produced by any other suitable molding method.

The base 2 includes a support portion 7 on which the mount 3 is positioned. The support portion 7 is constituted by a top-open cavity 8 formed in the top of the base 2, a rear wall 9 and a pair of side walls 10 rising from the bottom of the cavity 8, and a front edge portion 11 contiguous with the front edge 2a of the base 2. The side walls 10 each have a triangular shape rising from the front edge portion 11 toward the rear wall 9, as illustrated. The rear wall 9 is configured to connect the rearmost portions of the side walls 10. The rear surface or back of the rear wall 9 is configured to form part of an arc that has a center in the vicinity of the front edge portion 11 and extends in the up-and-down direction. It is to be noted that the arc mentioned above does not have to be a true arc, but should only be equivalent or approximate to a true arc.

FIG. 2 shows the rear surface of the base 2 and that of the rear wall 9 included in the support portion 7 in a fragmentary view. As shown in FIGS. 1B and 2, the rear wall 9 is formed with fixing portions for fixing the mount 3 at its center and opposite end portions. Each fixing portion includes an array of three holes 13 extending in the up-and-down direction. As shown in FIG. 15, a sheet of metal 15 is positioned in the cavity 8 of the base 2 inward of the rear wall 9 and protrudes upward from the cavity 8. The sheet metal 15 is also formed with three arrays of three screw holes 16 extending in the up-and-down direction and corresponding in position to the holes 13 of the support portion 7. As shown in FIGS. 1B and 2, a concave, pin support portion 10a is formed in the outer surface of each side wall 10 adjoining the front edge 2a. The pin support portion 10a plays the role of a fulcrum about which the mount 3 is angularly movable, as will be described specifically later. Another pin support portion 10 is, of course, formed in the other side wall 10 although not shown specifically.

Figure 4:
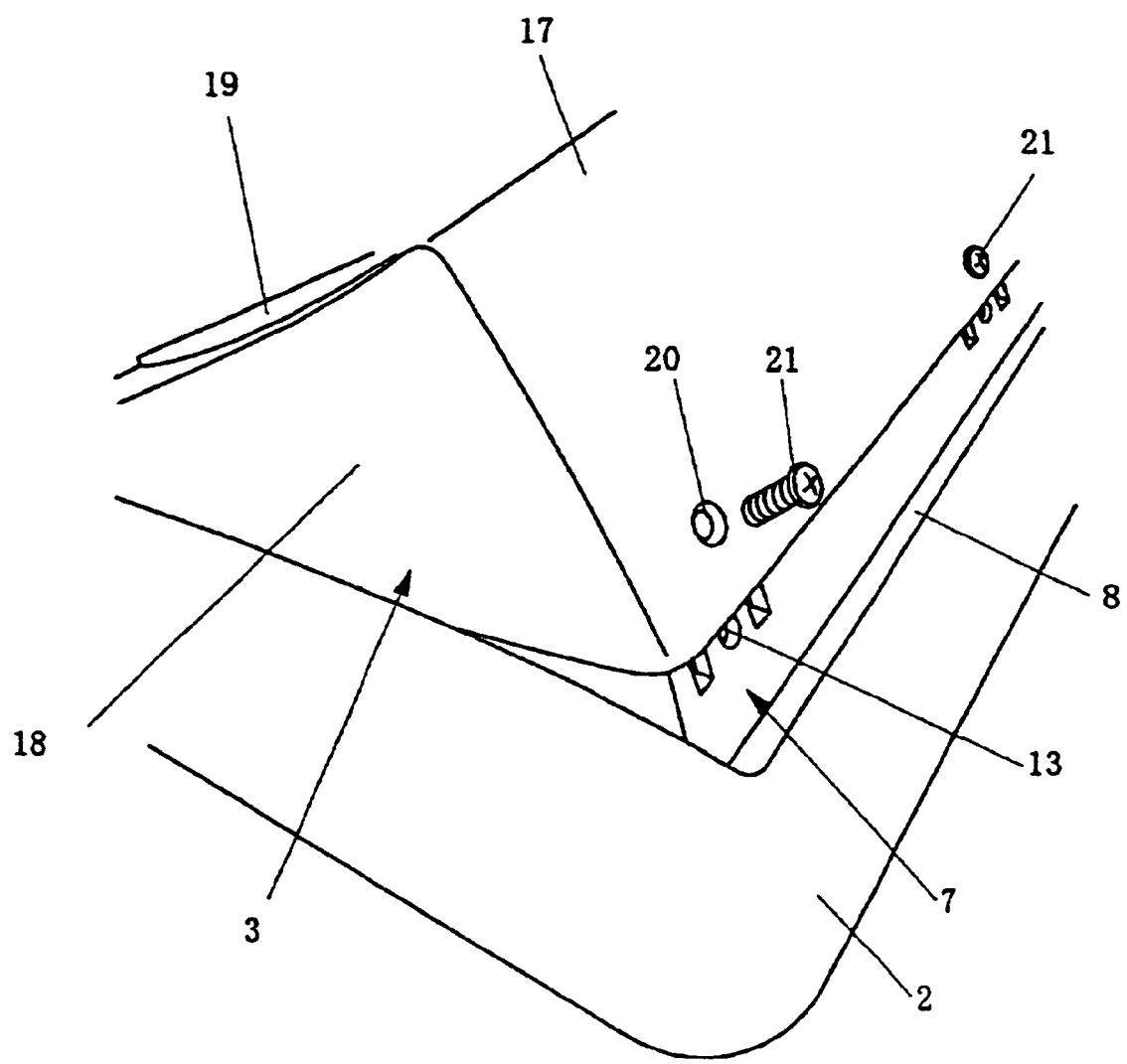
FIG. 4 is fragmentary isometric view showing the rear end of the illustrative embodiment.

As shown in FIGS. 1B and 4, the mount 3 has a bottom-open lid-like configuration including a rear wall 17, a pair of side walls 18 and a top 19 on which the display panels 5 and 6 and so forth are positioned. The mount 3 with such a configuration is mounted to the support portion 7 of the base 2 in such a manner as to cover the same. The rear wall 17 and side walls 18 correspond in shape to the rear wall 9 and side walls 10 of the support portion, respectively. The mount 3 is sized slightly larger than the support portion 7 of the base 2, so that the rear wall 17 and side walls 18 of the mount 3 are respectively positioned outward of the rear wall 9 and side walls 10 of the base 2 when the mount 3 is mounted to the support portion 7 from above.

Three holes 20 are formed in the rear wall 17 of the mount 3 and correspond in position to the holes 13 formed in the rear wall 9 of the support portion 7 and the screw holes 16 of the sheet metal 15. A screw 21 is driven into any one of the screw holes 16 via corresponding one of the holes 13 to thereby fix the position of the rear wall 17 of the mount 3 on the base 2.

Further, as shown in FIG. 1B, pins 22 each are studded on the respective side wall 18 of the mount 3 at a position slightly rearward of the front edge 3a of the mount 3. The pins 22 are engaged with the pin support portions 10a formed in the side walls 10 of the base 2, so that the mount 3 is supported by the base 2 in such a manner as to be angularly movable about the pin support portions 10a in the up-and-down direction.

The angle or tilt of the display panels 5 and 6 and so forth arranged on the mount 3 is variable, as will be described hereinafter. First, the screws 21 are pulled out from the holes 20 and 13 of the mount 3 and base 2, respectively, and screw holes 16 of the sheet metal 15 aligning with each other. Subsequently, the mount 3 is angularly moved about the pins 22 to locate the rear wall 17 of the mount 3 at desired level or height and therefore to provide the top 19 with a desired angular position. Thereafter, the screws 21 are again driven into the screw holes 16 matching with such a new position of the mount 3 via corresponding ones of the holes 13 for thereby fixing the mount 3 in the new position.

In the illustrative embodiment, the rear walls 17 and 9 of the mount 3 and base 2, respectively, both are configured to form part of an arc. Therefore, when the mount 3 is angularly moved upward or downward, the inner surfaces of the side walls 18 included in the mount 3 can smoothly move upward or downward while being spaced from the outer surfaces of the side walls 9 included in the base 2 by a preselected distance. Of course, the rear wall 17 included in the mount 3 may be provided with a modified contour indicated by an imaginary line X in FIG. 3 so long as it does not obstruct the angular movement of the mount. As shown in FIGS. 1A and 1B, the top 19 of the mount 3 is formed with an opening 19a for mounting, e.g., the display panel 5.

Figure 5:
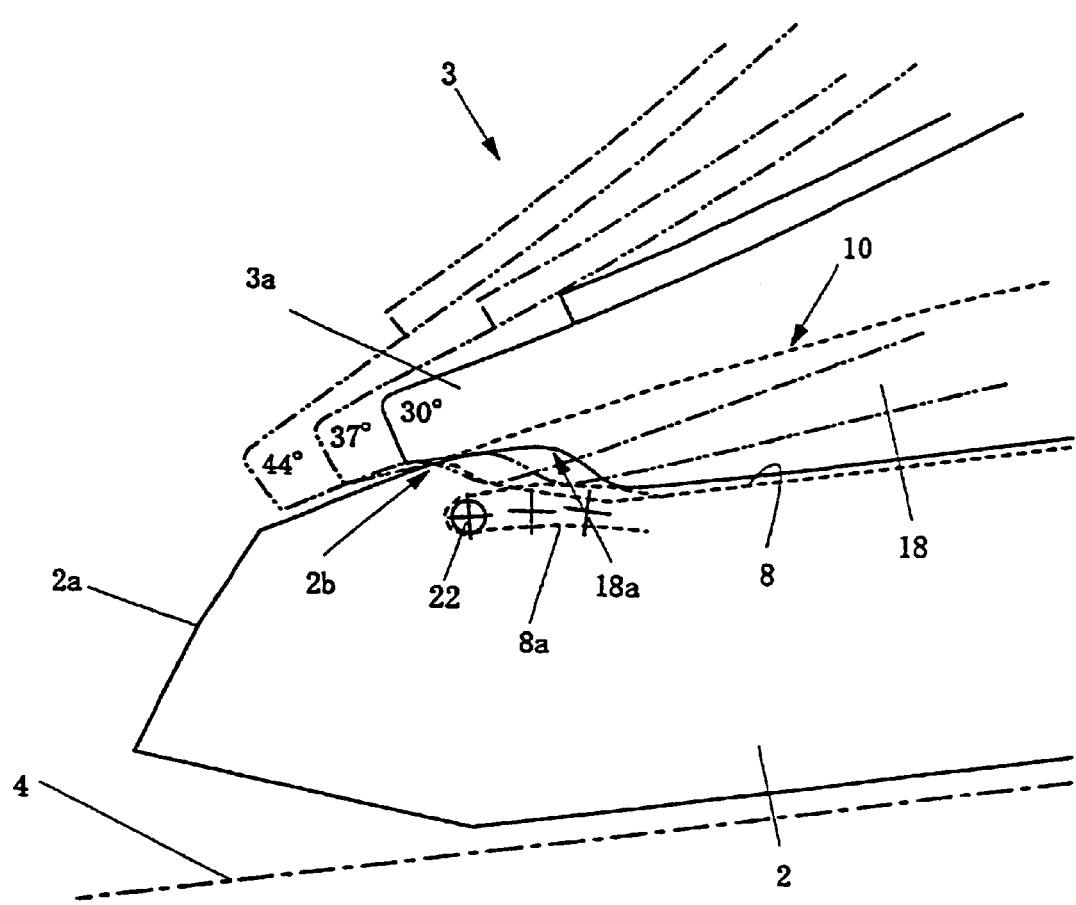
FIG. 5 is a fragmentary section showing an alternative embodiment of the control panel in accordance with the present invention.

An alternative embodiment of the control panel in accordance with the present invention will be described with reference to FIG. 5 hereinafter. The alternative embodiment differs from the previous embodiment in that the front edge 3a of the mount 3 is not fixed in position. As shown in FIG. 5, in the illustrative embodiment, guides 8a (only one is visible) implemented as guide rails or guide grooves, are provided on the side walls of the cavity 8 formed in the base 2. The pins 22, which are studded on the side walls 18 of the mount 3 and may be different in position from the pins 22 of the previous embodiment, each are movably received in one of the guides 8a, constituting the fulcrum about which the mount 3 is angularly movable.

More specifically, a downwardly open recess 18a is formed in the front edge portion of each side wall 18 of the mount 3. The underside of the front edge 3a of the mount 3 is so configured as to correspond to or not protrude downward from the recess 18a. On the other hand, part of the front edge of the support portion 7 corresponding to the above part of the side wall 18, more specifically extending between the front edge of the recess 18a and the front edge 2a of the base 2, is implemented as a projection 2b protruding upward over the entire length of the front edge of the base 2. It is to be noted that the above part of the support portion 7 corresponds to the front edge portion 11 of the support portion 7 included in the previous embodiment. Further, the surface of the support portion 7 between the recess 8 and the projection 2b is matched in configuration to the recess 18a and portions adjoining it. The prerequisite is that even when the mount 3 is angularly moved to the lowermost position represented by an angle of 30° in FIG. 5, its front edge 3a remains on the projection 2b.

In the above configuration, when the mount 3 is angularly moved upward or downward, it turns about the pin 22. When the mount 3 is moved upward, the pins 22 slide in the respective guides 8a toward the front edge 2a of the base 2. Consequently, the front edge 3a of the mount 3 slides toward the front edge 2a of the base 2, as indicated by consecutive angles of 37° and 44° in FIG. 5. It is noteworthy that the gap between the bottom of the front edge 3a of the mount 3 and the top of the front edge 2a of the base 2 is extremely small and remains substantially constant, as illustrated. Should the above gap be large, it would degrade the external appearance of the control panel and would easily allow, e.g., dust into the control panel.

As stated above, the illustrative embodiments of the present invention are constructed such that the mount or case 3, loaded with the display panels 5 and 6 and so forth and implemented by a single molding, is angularly movable without resorting to hinges, dampers or similar extra members for a rotation mechanism. This not only reduces the cost of the control panel, but also allows the whole mount 3 to be easily recycled for environmental preservation.

Further, the mount 3 is fixed in place at both of the front edge side and rear edge side and therefore provided with mechanical strength great enough to withstand manual operation. In addition, the angle of the control panel is variable in matching relation to the operator's height or eye level so as to obviate, e.g., glare ascribable to illumination, promoting the universal or global design of the entire control panel.

It should be noted that the present invention is applicable to any one of an image forming apparatus having at least one of various functions including a copier function, a facsimile function and a printer function, an ATM (Automatic-Teller Machine), a car, motorcycle or similar vehicle, a cash dispenser, a washing machine, a microwave oven or similar apparatus, an industrial apparatus for display, a signboard and so forth.

Various modifications will become possible for those skilled in the art after receiving the teachings of the present disclosure without departing from the scope thereof.

What is claimed is:

1. A control panel for a copier or similar image forming apparatus, comprising:

a base; and a mount mounted on said base and loaded with a display and devices to be operated by an operator of said apparatus;

said base including a support portion for supporting said mount and configured to support a front edge portion of said mount by causing said front edge portion to slidably contact a front edge portion of said support portion in substantially a front-and-rear direction, and to support a rear wall of said mount with a rear wall of said support portion such that said rear wall of said mount is movable in an up-and-down direction and is fixed in position in said up-and-down direction, wherein said support portion and said mount each include a pair of side walls contiguous with respective rear walls thereof, wherein the rear wall of said support portion has a contour that forms part of an arc having a center coincident with the front edge portion of said support portion and extending in the up-and-down direction, the rear wall of said mount has a contour corresponding to the contour of the rear wall of said support portion, and the rear wall of said mount is positioned outwardly of the rear wall of said support portion, wherein a downwardly open recess is formed in a bottom portion of the front edge of said mount over an entire length of said front edge portion of support portion.

2. The control panel as claimed in claim 1, wherein said support portion of said base and said mount both increase in height from the respective front edge portions toward the respective rear walls.

3. The control panel as claimed in claim 1, wherein the rear wall of said support portion is formed with, at different levels, at least two fixing portions configured to fix said mount in position.

4. A control panel for a copier or similar image forming apparatus, comprising:

a base; and a mount mounted on said base and loaded with a display and devices to be operated by an operator of said apparatus;

said base including a support portion for supporting said mount and configured to support a front edge portion of said mount by causing said front edge portion to slidably contact a front edge portion of said support portion in substantially a front-and-rear direction, and to support a rear wall of said mount with a rear wall of said support portion such that said rear wall of said mount is movable in an up-and-down direction and is fixed in position in said up-and-down direction, such that an angle of a top of said mount in the closed, operation position is variable, wherein said support portion of said base and said mount both increase in height from the respective front edge portions toward the respective rear walls, and wherein the rear wall of said support portion has a contour that forms part of an arc having a center coincident with the front edge portion of said support portion and extending in the up-and-down direction, the rear wall of said mount has a contour corresponding to the contour of the rear wall of said support portion, and the rear wall of said mount is positioned outwardly of the rear wall of said support portion; and wherein a downwardly open recess is formed in a bottom portion of the front edge portion of said mount over an entire length of said front edge portion of support portion, an upward projection is formed on the front edge portion of said support portion over an entire length of said front edge portion, and a rearmost part of the recess is positioned rearward of a rearmost part of said projection, and wherein said support portion and said mount each include a pair of side walls contiguous with respective rear walls thereof.

5. The control panel as claimed in claim 4, wherein said side walls each increase in height from the front edge portion toward said rear wall, and wherein said mount comprises a bottom-open lid member delimited by the rear wall and the pair of side walls and formed with a portion that forms the recess in a front edge portion of each of said pair of side walls.

6. The control panel as claimed in claim 5, wherein said support portion includes a top-open cavity delimited by the rear wall and the pair of side walls and a portion that forms the projection.

7. The control panel as claimed in claim 6, wherein the rear wall of said support portion is formed with, at different levels, at least two fixing portions configured to fix said mount in position.

8. The control panel as claimed in claim 5, wherein said base and said mount each comprise a particular molding capable of being formed of synthetic resin.

9. A control panel for a copier or similar image forming apparatus, comprising:

a base; and a mount mounted on said base and loaded with a display and devices to be operated by an operator of said apparatus;

said base including a support portion for supporting said mount and configured to support a front edge portion of said mount by causing said front edge portion to slidably contact a front edge portion of said support portion in substantially a front-and-rear direction, and to support a rear wall of said mount with a rear wall of said support portion such that said rear wall of said mount is movable in an up-and-down direction and is capable of being fixed in position in said up-and-down direction, whereby an angle of a top of said mount is variable, wherein the rear wall of said support portion has a contour that forms part of an arc having a center coincident with the front edge portion of said support portion and extending in the up-and-down direction, the rear wall of said mount has a contour corresponding to the contour of the rear wall of said support portion, and the rear wall of said mount is positioned outwardly of the rear wall of said support portion, wherein a downwardly open recess is formed in a bottom portion of the front edge of said mount over an entire length of said front edge portion of support portion.

\* \* \* \* \*